United States Patent [19]
Lee

[11] Patent Number: 5,701,271
[45] Date of Patent: Dec. 23, 1997

[54] INTEGRATED CIRCUIT MEMORY DEVICES INCLUDING BANKS OF MEMORY BLOCKS

[75] Inventor: Seung-hun Lee, Kyungki-do, Rep. of Korea

[73] Assignee: Samsung Electronics Co., Ltd., Suwon, Rep. of Korea

[21] Appl. No.: 703,203

[22] Filed: Aug. 26, 1996

[30] Foreign Application Priority Data

Aug. 24, 1995 [KR] Rep. of Korea .................. 1995-26422

[51] Int. Cl.$^6$ .................................................. G11C 13/00
[52] U.S. Cl. .................. 365/230.02; 365/189.01; 365/230.01
[58] Field of Search .............. 365/189.01, 189.02, 365/189.04, 230.01, 230.03

[56] References Cited

U.S. PATENT DOCUMENTS 4,658,377  4/1987  McElroy ..................... 365/189.01

Primary Examiner—Terrell W. Fears
Attorney, Agent, or Firm—Myers, Bigel, Sibley & Sajovec, L.L.P.

[57] ABSTRACT

An integrated circuit memory device includes a plurality of memory banks. Each of the memory banks includes a first array of at least four memory blocks and a second array of at least four memory blocks wherein each of the memory blocks includes at least two bit lines. Each of the memory blocks from the second array is paired with a respective memory block from the first array and the memory blocks are activated as pairs with at least one pair being activated during a data access operation. Four data lines are provided adjacent the first and second arrays of memory blocks. A plurality of input/output lines directly connects two of the bit lines from each of the memory blocks with two of the input/output lines so that for any pair of the memory blocks, two bit lines from each memory block of the pair are connected to separate data lines.

13 Claims, 3 Drawing Sheets

INTEGRATED CIRCUIT MEMORY DEVICES INCLUDING BANKS OF MEMORY BLOCKS

FIELD OF THE INVENTION

The present invention relates to the field of integrated circuits and more particularly to the field of integrated circuit memory devices.

BACKGROUND OF THE INVENTION

Integrated circuit memory devices are judged in terms of operating power, operating speed, level of integration, and functionality. In particular, memory devices with a high memory capacity capable of operating at high speeds with low power consumption are desirable. Furthermore, high speed memory devices which can be synchronized with a system clock have been developed to increase operating speeds. In addition, various memory device operating modes have been established to provide access to multiple bits of data during each data access operation (or cycle). In such a device, the number of input/output lines and data lines may be increased to provide access to multiple bits of data. The size of the memory device may increase, however, as the number of transmission lines increases, thus reducing the level of integration of the memory device.

A conventional integrated circuit memory device will now be described with reference to FIGS. 1 and 2. In FIG. 1, a memory array has four memory banks 100, 200, 300, and 400, with each memory bank including eight memory blocks BLK1 to BLK8. A group of data lines 101, 201, 301, and 401 is formed adjacent each of the memory banks. Each group of data lines is connected to a common data line group 500 which is in turn connected to data input/output pads. Either input drivers or output sense amplifiers 10, 20, 30, and 40 can be connected between the groups of data lines 101, 201, 301, and 401 and the common data line group 500.

If the memory device of FIG. 1 is a 16 megabit DRAM, the memory capacity of each memory bank will be 4 megabits, and the memory capacity of each memory block will be 512 kilobits. During a data access operation (or cycle), a memory bank and a memory block are selected by decoding a plurality of address signals. In order to prevent data collision, only one memory bank should be selected during a data access operation. Two memory blocks within the selected memory bank can be simultaneously activated during the data access operation.

For example, if the memory bank 100 is selected, two of its memory blocks can be simultaneously activated during a data access operation by block selection information provided within the row address signal for that data access operation. If the memory block BLK1 is activated, the memory block BLK5 is simultaneously activated. Furthermore, memory blocks BLK2 and BLK6, BLK3 and BLK7, and BLK4 and BLK8 can each be activated as pairs. During the data access operation, four bits of data can be written to or read from each of the two selected memory blocks. Accordingly, eight data bits can be written to or read from the selected memory bank during a data access operation.

In FIG. 2, the connections of input/output lines IO1 to IO18 and data lines DIO1 to DIO8 are illustrated for the memory bank 100 of FIG. 1. As discussed above, the memory bank 100 includes eight memory blocks BLK1 to BLK8. Eight data lines DIO1 to DIO8 can be formed adjacent to the memory blocks. In addition, two input/output lines are provided at both sides of each memory block so that the memory bank 100 includes eighteen input/output lines IO1 to IO18.

The input/output lines IO1 and IO2 are connected to the data lines DIO1 and DIO2, respectively. The input/output lines IO3 and IO4 are connected to the data lines DIO3 and DIO4, respectively. The input/output lines IO5 and IO6 are connected to the data lines DIO1 and DIO2, respectively. The input/output lines IO7 and IO8 are connected to the data lines DIO3 and DIO4, respectively. The input/output line IO9 is connected to the data lines DIO1 and DIO5 via the multiplexer 1. The input/output line IO10 is connected to the data lines DIO2 and DIO6 via multiplexer 2. The input/output lines IO11 and IO12 are connected to the data lines DIO7 and DIO8, respectively. The input/output lines IO13 and IO14 are connected to the data lines DIO5 and DIO6, respectively. The input/output lines IO15 and IO16 are connected to the data lines DIO7 and DIO8, respectively. The input/output lines IO17 and IO18 are connected to the data lines DIO5 and DIO6, respectively.

Bit lines of the respective memory blocks are disposed in an interleaved manner as shown. In other words, two bit lines from each memory block extend from each side of that memory block, and bit lines on adjacent sides of adjacent memory blocks are connected. Accordingly, a bit line sense amplifier can be connected to adjacent memory blocks. Other peripheral circuits such as an isolation gate, a sense amplifier, and an input/output driver can also be produced for the memory device as will be understood by one having skill in the art.

Upon initiation of a read operation, a row address strobe signal (RASB) and a column address strobe signal (CASB) are generated by a memory controller and provided to the groups of input/output lines. The RASB and CASB signals are external signals which permit the input of address signals designating the memory cells of the memory arrays within the memory blocks. When the address signal is generated by the memory controller and input into the memory device, address multiplexers divided the input signal into row and column address signals which select a predetermined memory bank and memory blocks of the memory bank.

For the purpose of illustrating the operation of the memory device of FIGS. 1 and 2, the operation will be described for a data access operation wherein the memory bank 100 and the memory blocks BLK1 and BLK5 are selected by a specific row input address. Four bits of data are then generated by memory block BLK1 and output through input/output lines IO1 to IO4 and data lines DIO1 to DIO4. Four bits of data are also generated by memory block BLK5 and output through the input/output lines IO9 to IO12 and data lines DIO1 to DIO2 and DIO5 to DIO8. Eight bits of data are thus generated during one reading access operation (or cycle). By connecting each of the bit lines from memory blocks BLK1 and BLK5 to a different data line DIO1 to DIO8, each bit of data is output through a different data line, and data collision does not occur during the data read access operation.

As shown in FIG. 2, the input/output lines IO1 to IO18 which are disposed adjacent the memory blocks BLK1 to BLK8 are connected to the bit lines of adjacent memory blocks. When the memory blocks BLK4 and BLK5 are selected, however, the input/output lines IO9 and IO10, located therebetween, transfer data to different data lines depending on which memory block is selected. In other words, the input/output line IO9 is connected to either data line DIO1 or DIO5 depending on the operation of multiplexer 1, and input/output line IO10 is connected to either data line DIO2 or DIO6 depending on the operation of multiplexer 2.

The multiplexers 1 and 2 are thus provided on input/output lines IO9 and IO10 to select one of the data lines and to connect the input/output lines IO9 and IO10 to the selected data line. As discussed above, two memory blocks are simultaneously activated during a single data access operation. For example, when memory block BLK1 is selected, the memory block BLK5 is simultaneously selected. Furthermore, each memory block is connected to adjacent input/output lines which are in turn connected to respective data lines. Accordingly, the memory block BLK1 uses the data lines DIO1 to DIO4, while the memory block BLK5 uses the data lines DIO5 to DIO8. If the memory block BLK4 is selected, the memory block BLK8 is simultaneously selected. The memory block BLK8 uses the data lines DIO5 to DIO8, while the memory block BLK4 uses the data lines DIO1 to DIO4.

As shown, input/output line IO9 must be selectively connected to either data line DIO1 or DIO5, and input/output line IO10 must be selectively connected to either data line DIO2 or DIO6. The multiplexers 1 and 2 are thus employed on the input/output lines IO9 and IO10, due to the structural characteristics of the memory device configured with the interleaved structure. A portion of the circuit A designated with a dotted circle in FIG. 2 illustrates the structural problem.

The multiplexers 1 and 2 illustrated in the circuit of FIG. 2 may consume space on the semiconductor chip on which the memory device is formed thus reducing the space available for memory circuits. The integration of the memory device may thus be reduced.

SUMMARY OF THE INVENTION

The present invention is an integrated circuit memory device including a plurality of memory banks. In particular, each of the memory banks includes a first array of at least four memory blocks and a second array of at least four memory blocks wherein each of the memory blocks includes at least two bit lines. In addition, each of the memory blocks from the second array is paired with a respective memory block from the first array and the memory blocks are activated as pairs with at least one pair being activated during an access operation. Four data lines are provided adjacent the first and second arrays of memory blocks. A plurality of input/output lines directly connects two of the bit lines from each of the memory blocks with two of the input/output lines so that for any pair of the memory blocks, two bit lines from each memory block of the pair are connected to separate data lines.

The integrated circuit memory device of the present invention can thus operate without multiplexing input/output lines from any of the memory blocks. Accordingly, the size of the chip used to produce the memory device can be reduced. More particularly, the memory blocks of the first and second arrays can be arranged in a row wherein bit lines of adjacent memory blocks are electrically connected so that one input/output line connects two bit lines from two different memory blocks to a respective data line. Accordingly, the number of input/output lines can be reduced further reducing the size of the memory device.

Alternately, each of the memory banks may include a first array of memory blocks and a second array of memory blocks wherein each of the memory blocks includes at least two bit lines. Again, each of the memory blocks from the second array is paired with the respective memory block from the first array, and the memory blocks are activated as pairs with at least one pair being activated during a data access operation. A plurality of data lines is provided adjacent the first and second arrays of memory blocks, and a plurality of input/output lines directly connect each of the bit lines with the respective data line without multiplexing any of the input/output lines. Multiplexers are thus eliminated from the circuit reducing the size thereof.

The present invention thus provides highly integrated memory devices on a reduced surface area of a substrate. Accordingly, the size and the complexity of the memory device can be reduced.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The connection of input/output lines and data lines according to the present invention will be discussed with reference to FIG. 3. Elements labeled as discussed above with regard to FIG. 2 operate as discussed above with regard to FIG. 2. In the memory device of FIG. 3, however, no multiplexers are used on the input/output lines IO9 and IO10 between the memory blocks BLK4 and BLK5. Instead, the input/output lines and data lines are connected as discussed below.

Figure 1:
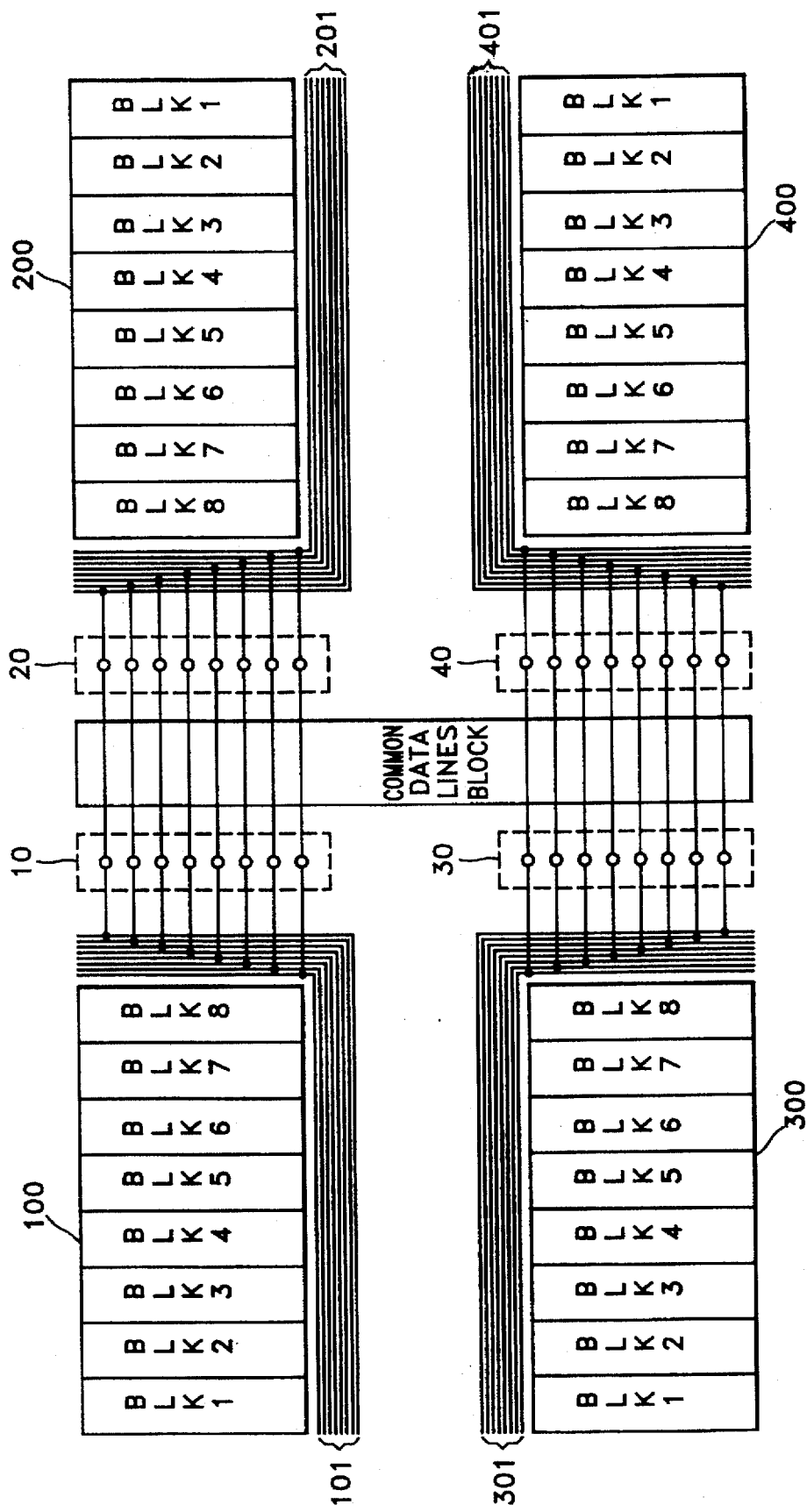
FIG. 1 illustrates the structure of an integrated circuit memory device according to the prior art.
Figure 2:
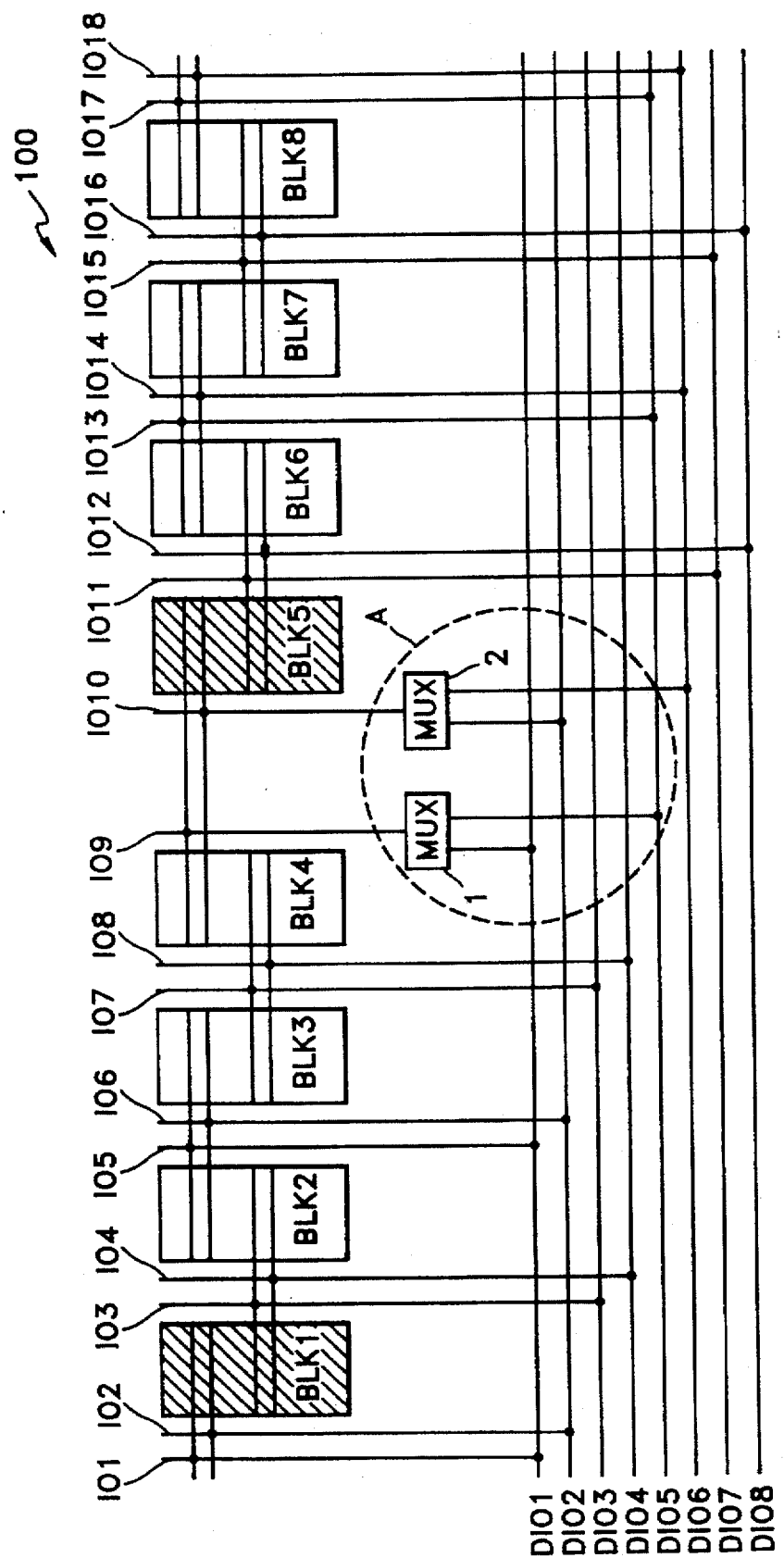
FIG. 2 illustrates the connections of input/output lines and data lines of the memory device of FIG. 1.

Input/output lines IO1 and IO2 are connected to data lines DIO5 and DIO6, respectively. Input/output lines IO9 and IO10 are directly connected to data lines DIO1 and DIO2, respectively. The remaining input/output lines IO3 to IO8 and IO11 to IO18 are connected to respective data lines DIO1 to DIO8, as shown in FIG. 2. The memory blocks BLK1 to BLK8 are also arranged in the same manner as discussed above with regard to FIG. 2.

In particular, the memory bank 100 includes eight memory blocks BLK1 to BLK8. Eight data lines DIO1 to DIO8 are arranged adjacent to the memory bank. The memory blocks BLK1 to BLK8 have a pair of input/output lines on the right and left sides thereof. The memory bank 100 thus has a total of 18 input/output lines IO1 to IO18. Furthermore, bit lines are disposed in the respective memory blocks according to the interleaved manner. The memory device may also include other peripheral circuits such as a sense amplifier circuit, an isolation gate, and an input/output driver.

Figure 3:
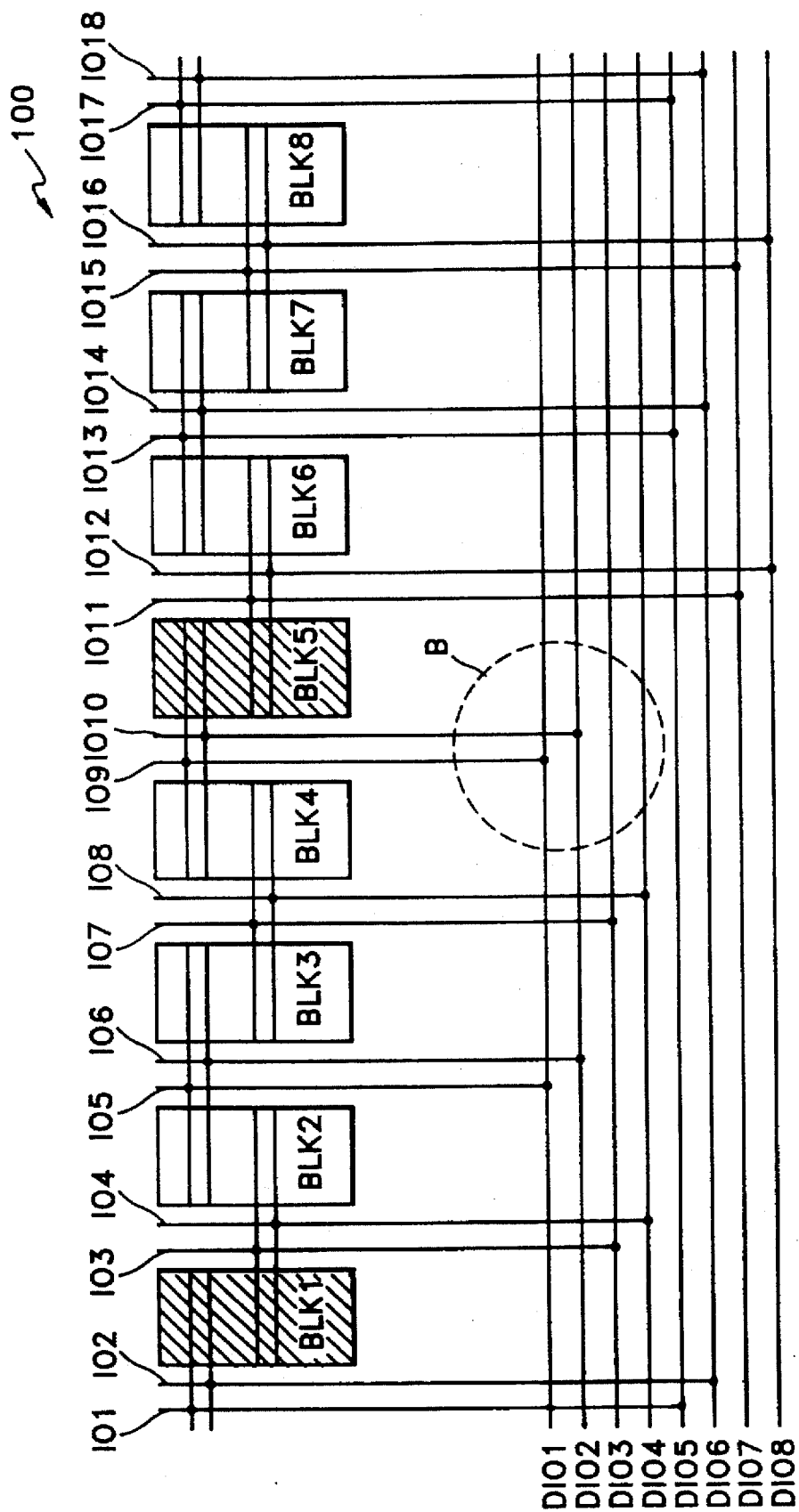
FIG. 3 illustrates the connections of input/output lines and data lines of a memory device according to the present invention.

In the memory device of FIG. 3, the input/output lines IO1 and IO2 are connected to the data lines DIO5 and DIO6, instead of the data lines DIO1 and DIO2 as shown in FIG. 2. In addition, the input/output lines IO9 and IO10 are respectively connected to the data lines DIO1 and DIO2, instead of the data lines DIO1, DIO5, DIO2, and DIO6 as shown in FIG. 2. A memory device which can read and write eight bits of data simultaneously is thus achieved without using multiplexers. Instead, the input/output lines are connected directly to data lines. A portion B of the device illustrating the connection of input/output lines IO9 and IO10 with data lines DIO1 and DIO2 is designated by a dotted circle.

According to the memory device of the present invention, no multiplexer is needed to access multiple bits of data even though at least two memory blocks are simultaneously activated during an access operation. Accordingly, the integrated circuit memory device can be fabricated on a smaller portion of a semiconductor chip. While the embodiment of the invention discussed above refers to a 16 megabit DRAM memory device, the structure of the present invention can be applied to highly integrated memory devices of over 16 megabits as will be understood by those having skill in the art. In addition, while the embodiment discussed above is discussed as allowing two memory blocks to be activated during one data access cycle, more than two memory blocks can be activated at a time. In addition, more than eight bits can be read or written during a data access cycle, and four, eight, or even sixteen memory blocks can be activated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device including a plurality of memory banks, wherein each of said memory banks comprises:
   a first array of at least a first memory block, a second memory block, a third memory block, and a fourth memory block wherein each of said memory blocks includes first and second bit lines;
   a second array of at least a fifth memory block, a sixth memory block, a seventh memory block, and an eighth memory block wherein each of said memory blocks includes first and second bit lines, and wherein each of said memory blocks from said second array is paired with a respective memory block from said first array and wherein said memory blocks are activated as pairs with at least one pair being activated during a data access operation;
   four data lines adjacent said first and second arrays of memory blocks; and
   a plurality of input/output lines directly connecting two of said bit lines from each of said memory blocks with two of said input output lines wherein a first bit line of said first memory block and a second bit line of said eighth memory block are connected to a first one of said data lines, wherein a second bit line of said first memory block and a first bit line of said second memory block are connected to a second data line, wherein a second bit line of said second memory block and a first bit line of said fifth memory block are connected to a third bit line, and wherein a second bit line of said fifth memory block and a first bit line of said sixth memory block are connected to a fourth data line, so that for any pair of said memory blocks, two bit lines from each memory block of said pair are connected to separate data lines.

2. An integrated circuit memory device according to claim 1 wherein said memory blocks of said first and second arrays are arranged in a row and wherein bit lines of adjacent memory blocks are electrically connected so that one input/output line connects two bit lines from two different memory blocks to a respective data line.

3. An integrated circuit memory device including a plurality of memory banks, wherein each of said memory banks comprises:
   a first array of at least four memory blocks wherein each of said memory blocks includes at least two bit lines;
   a second array of at least four memory blocks wherein each of said memory blocks includes at least two bit lines, and wherein each of said memory blocks from said second array is paired with a respective memory block from said first array and wherein said memory blocks are activated as pairs with at least one pair being activated during a data access operation;
   four data lines adjacent said first and second arrays of memory blocks; and
   a plurality of input/output lines directly connecting two of said bit lines from each of said memory blocks with two of said input output lines so that for any pair of said memory blocks, two bit lines from each memory block of said pair are connected to separate data lines;
   wherein said first array of memory blocks comprises first, second, third, and fourth memory blocks, said second array of memory blocks comprises fifth, sixth, seventh, and eighth memory blocks, with said first and fifth memory blocks being paired, said second and sixth memory blocks being paired, said third and seventh memory blocks being paired, and said fourth and eighth memory blocks being paired, wherein
   a first bit line of said first memory block is connected to a third data line via a first input/output line;
   a second bit line of said first memory block and a first bit line of said second memory block are connected to a second data line via a second input/output line;
   a second bit line of said second memory block and a first bit line of said third memory block are connected to a first data line via a third input/output line;
   a second bit line of said third memory block and a first bit line of said fourth memory block are connected to said second data line via a fourth input/output line;
   a second bit line of said fourth memory block and a first bit line of said fifth memory block are connected to said first data line via a fifth input/output line;
   a second bit line of said fifth memory block and a first bit line of said sixth memory block are connected to a fourth data line via a sixth input/output line;
   a second bit line of said sixth memory block and a first bit line of said seventh memory block are connected to said third data line via a seventh input/output line;
   a second bit line of said seventh memory block and a first bit line of said eighth memory block are connected to said fourth data line via an eighth input/output line; and
   a second bit line of said eighth memory block is connected to said third data line via a ninth input/output line.

4. An integrated circuit memory device including a plurality of memory banks, wherein each of said memory banks comprises:
   a first array of at least a first memory block and a second memory block wherein each of said memory blocks includes first and second bit lines;
   a second array of at least a third memory block and a fourth memory block wherein each of said memory blocks includes first and second bit lines, and wherein each of said memory blocks from said second array is paired with a respective memory block from said first array and wherein said memory blocks are activated as pairs with at least one pair being activated during a data access operation;

four data lines adjacent said first and second arrays of memory blocks; and a plurality of input/output lines directly connecting two of said bit lines from each of said memory blocks with two of said input output lines wherein a first bit line of said first memory block and a second bit line of said fourth memory block are connected to a first one of said data lines, wherein a second bit line of said first memory block and a first bit line of said second memory block are connected to a second data line, wherein a second bit line of said second memory block and a first bit line of said third memory block are connected to a third bit line, and wherein a second bit line of said third memory block and a first bit line of said fourth memory block are connected to a fourth data line, so that for any pair of said memory blocks, two bit lines from each memory block of said pair are connected to separate data lines.

5. An integrated circuit memory device according to claim 4 wherein said memory blocks of said first and second arrays are arranged in a row and wherein bit lines of adjacent memory blocks are electrically connected so that one input/output line connects two bit lines from two different memory blocks to a respective data line.

6. An integrated circuit memory device including a plurality of memory banks, wherein each of said memory banks comprises:

a first array of at least two memory blocks wherein each of said memory blocks includes at least two bit lines;

a second array of at least two memory blocks wherein each of said memory blocks includes at least two bit lines, and wherein each of said memory blocks from said second array is paired with a respective memory block from said first array and wherein said memory blocks are activated as pairs with at least one pair being activated during a data access operation;

four data lines adjacent said first and second arrays of memory blocks; and a plurality of input/output lines directly connecting two of said bit lines from each of said memory blocks with two of said input output lines so that for any pair of said memory blocks, two bit lines from each memory block of said pair are connected to separate data lines;

wherein said first array of memory blocks comprises first and second memory blocks, and said second array of memory blocks comprises third and fourth memory blocks, with said first and third memory blocks being paired, and said second and fourth memory blocks being paired, wherein a first bit line of said first memory block is connected to a third data line via a first input/output line;

a second bit line of said first memory block and a first bit line of said second memory block are connected to a second data line via a second input/output line;

a second bit line of said second memory block and a first bit line of said third memory block are connected to a first data line via a third input/output line;

a second bit line of said third memory block and a first bit line of said fourth memory block are connected to a fourth data line via a fourth input/output line; and a second bit line of said fourth memory block is connected to said third data line via a fifth input/output line.

7. An integrated circuit memory device including a plurality of memory banks, wherein each of said memory banks comprises:

a first array of memory blocks including at least a first memory block and a second memory block wherein each of said memory blocks of said first array includes first and second bit lines;

a second array of memory blocks including at least a third memory block and a fourth memory block wherein each of said memory blocks of said second array includes first and second bit lines, wherein each of said memory blocks from said second array is paired with a respective memory block from said first array, and wherein said memory blocks are activated as pairs with at least one pair being activated during a data access operation;

a plurality of data lines adjacent said first and second arrays of memory blocks; and a plurality of input/output lines which directly connect each of said bit lines with a respective data line without multiplexing any of said input/output lines wherein a first bit line of said first memory block and a second bit line of said fourth memory block are connected to a first one of said data lines, wherein a second bit line of said first memory block and a first bit line of said second memory block are connected to a second data line, wherein a second bit line of said second memory block and a first bit line of said third memory block are connected to a third bit line, and wherein a second bit line of said third memory block and a first bit line of said fourth memory block are connected to a fourth data line.

8. An integrated circuit memory device according to claim 7 wherein said input/output lines are connected between said bit lines and said data lines so that for any pair of said memory blocks, two bit lines from each memory block of said pair are connected to separate data lines.

9. An integrated circuit memory device according to claim 7 wherein said memory blocks of said first and second arrays are arranged in a row and wherein bit lines of adjacent memory blocks are electrically connected so that one input/output line connects two bit lines from two different memory blocks to a respective data line.

10. An integrated circuit memory device according to claim 7 wherein each of said first and second arrays of memory blocks includes two memory blocks.

11. An integrated circuit memory device according to claim 7 wherein each of said first and second arrays of memory blocks includes four memory blocks.

12. An integrated circuit memory device according to claim 7 wherein each of said first and second arrays of memory blocks includes eight memory blocks.

13. An integrated circuit memory device including a plurality of memory banks, wherein each of said memory banks comprises:

a first array of memory blocks wherein each of said memory blocks of said first array includes at least two bit lines;

a second array of memory blocks wherein each of said memory blocks of said second array includes at least two bit lines, wherein each of said memory blocks from said second array is paired with a respective memory block from said first array, and wherein said memory blocks are activated as pairs with at least one pair being activated during a data access operation;

a plurality of data lines adjacent said first and second arrays of memory blocks; and a plurality of input/output lines which directly connect each of said bit lines with a respective data line without multiplexing any of said input/output lines;

wherein said first array of memory blocks comprises first and second memory blocks, and said second array of memory blocks comprises third and fourth memory blocks, wherein a first bit line of said first memory block is connected to a third data line via a first input/output line;

a second bit line of said first memory block and a first bit line of said second memory block are connected to a second data line via a second input/output line;

a second bit line of said second memory block and a first bit line of said third memory block are connected to a first data line via a third input/output line;

a second bit line of said third memory block and a first bit line of said fourth memory block are connected to a fourth data line via a fourth input/output line; and a second bit line of said fourth memory block is connected to said third data line via a fifth input/output line.

* * * * *